United States Patent [19]

Suzuki et al.

[11] Patent Number: 5,512,762

[45] Date of Patent: Apr. 30, 1996

[54] QUANTUM DEVICE WITH PLURAL STABLE STATES

[75] Inventors: Toshikazu Suzuki, Kanagawa; Kazumasa Nomoto, Tokyo; Ryuichi Ugajin, Kanagawa, all of Japan

[73] Assignee: Sony Corporation, Tokyo, Japan

[21] Appl. No.: 309,888

[22] Filed: Sep. 20, 1994

[30] Foreign Application Priority Data

Sep. 22, 1993 [JP] Japan .................................. 5-259482

[51] Int. Cl.[6] ...................... H01L 29/06; H01L 31/0328; H01L 31/0336

[52] U.S. Cl. .................. 257/15; 257/17; 257/21; 257/22

[58] Field of Search .................. 257/17, 21, 22, 257/15

[56] References Cited

U.S. PATENT DOCUMENTS

| 5,073,893 | 12/1991 | Kondou | 257/21 X |
|---|---|---|---|
| 5,126,804 | 6/1992 | Nagai et al. | 257/21 X |
| 5,293,050 | 3/1994 | Chapple-Sokol et al. | 257/21 X |
| 5,294,807 | 3/1994 | Ugajin et al. | 257/17 |

FOREIGN PATENT DOCUMENTS 5095103  4/1993  Japan ................................. 257/17

*Primary Examiner*—William Mintel
*Attorney, Agent, or Firm*—Hill, Steadman & Simpson

[57] ABSTRACT

A quantum box array comprising a plurality of quantum boxes is made by providing a plurality of box-shaped quantum well portions on a first barrier layer and a second barrier layer covering the quantum well portions. The quantum box array is designed so that interaction energy between electrons or holes is amply larger than transfer energy between the quantum boxes. A control electrode is provided on the second barrier layer to vary the number of electrons or holes in the quantum box array by changing the potential of the control electrode. In spite of using a relatively small number of electrons or holes, the quantum device can suppress fluctuation in density of electrons or holes, can have three or more states, and reduces the power consumption.

4 Claims, 4 Drawing Sheets

5,512,762

QUANTUM DEVICE WITH PLURAL STABLE STATES

BACKGROUND OF THE INVENTION

This invention relates to a quantum device, and more particularly to a quantum device using quantum boxes (also called quantum dots).

Existing electronic devices use a great number of electrons (on the order of $10^4$ electrons or more per bit) as those concerned in operation to utilize the law of large numbers, in order to alleviate relative fluctuation in the number of electrons (fluctuation in density of electrons) and thereby stabilize the operation of such devices.

It is desirable to use a small number of electrons from the view point of reducing power consumption of electronic devices. However, the use of such a small number of electrons disables the utilization of the law of great numbers and therefore causes the problem of fluctuation in the density of electrons.

On the other hand, it is difficult to hold three or more states in existing electronic devices.

OBJECTS AND SUMMARY OF THE INVENTION

It is, therefore, an object of the invention to provide a quantum device that can reduce the power consumption by using a relatively small number of electrons or holes as carriers concerned in operation and can suppress fluctuation in density of electrons or holes.

Another object of the invention is to provide a quantum device that can hold three or more states.

According to an aspect of the invention, there is provided a quantum device comprising a plurality of quantum boxes in which electrons or holes existing in the quantum boxes are variable in number, and interaction energy between electrons or holes is larger than transfer energy between the quantum boxes.

According to a working example of the invention, the device utilizes at least one of statistically stable or metastable spatial distributions of electrons or holes resulting from interactions among electrons or holes in the plurality of quantum boxes, disappearance of fluctuation in density of electrons or holes in the quantum boxes, and a characteristic feature of changes in the number of electrons or holes in the quantum boxes.

According to a working example of the invention, a respective one of the states of spatial distribution of electrons or holes in the quantum boxes is read out by utilizing an effective energy level due to many body interactions of the electrons or holes.

According to a working example of the invention, the plurality of quantum boxes comprises a first barrier layer, a plurality of box-like quantum well portions provided on the first barrier layer, and a second barrier layer provided on the first barrier layer so as to cover the plurality of quantum well portions. Electrons or holes existing in the plurality of quantum boxes are variable in number in response to changes in potential of a control electrode provided on the second barrier layer.

The first barrier layer, second barrier layer and quantum well portions may be made of, for example, AlGaAs, AlAs and GaAs, respectively.

In quantum devices according to the invention, interactions among electrons or holes in a plurality of quantum boxes and stable spatial distributions of electrons or holes can be modulated variously by designs. Methods for the modulation include designing the arrangement of the quantum boxes, modulating the intensity of screening by designing the distance of a layer of positive charges or negative charges caused by electrons or holes in the plurality of quantum boxes from the quantum boxes, and so forth.

Physical meaning of "transfer energy" in quantum devices according to the invention will be explained below.

Quantum boxes are made by quantum well portions surrounded three-dimensionally by barrier layers. The potential well of a single quantum box and the wave function of the ground state of an electron in the potential well can schematically be depicted as shown in FIG. 1.

Consideration is made below on a coupled quantum boxes system including two quantum boxes as shown in FIG. 2. Then, dynamics of electrons in the coupled quantum boxes system are discussed on the basis of the LCAO (Linear Combination of Atomic Orbitals) approximation known as an effective approximation method for analyzing the electronic state of a hydrogen molecule ion ($H_2^+$) from an exact solution of the electronic state of an isolated hydrogen atom.

On the basis of the LCAO approximation, when a quantum box 1 and a quantum box 2, initially isolated, approach to each other, a split of the width $2\Delta E$ occurs in the energy level $E_0$ in the ground state $|1>$ of the electron in the quantum box 1 and the ground state $|2>$ of the electron in the quantum box 2, and two states, bonding state and antibonding state, are obtained. Energies and wave functions of these bonding and antibonding states are shown by:

Bonding State $E_{bonding}=E_0-\Delta E$

Antibonding State $E_{antibonding}=E_0+\Delta E$ (1)

$|bonding> \propto [|1>+|2>]$ $|antibonding> \propto [|1>-|2>]$ (2)

$\Delta E$ is called transfer energy, and it gives a criterion for determination of the tunneling time $\tau$ of an electron between quantum boxes as referred to later. If the Hamiltonian of the coupled quantum boxes system is expressed as $\hat{H}_{LCAO}$, then the bonding state $|bonding>$ and the antibonding state $|antibonding>$ exhibit eigenstates of the Hamiltonian as described by the following equations:

$\hat{H}_{LCAO}|bonding>=(E_0-\Delta E)|bonding>$ $\hat{H}_{LCAO}|antibonding>=(E_0+\Delta E)|antibonding>$ (3)

Assuming that an electron is localized in, for example, the quantum box 1, this state can be expressed as:

$$|initial> = \frac{1}{\sqrt{2}} [|bonding> + |antibonding>]$$ (4)

By time evolution from this state in accordance with the Schrödinger equation, the state at the time t is:

$$|t> = \exp\left(i\frac{\hat{H}_{LCAO}t}{\hbar}\right)|initial> = \frac{1}{\sqrt{2}}\left[\exp\left(i\frac{\hat{H}_{LCAO}t}{\hbar}\right)|bonding> +\right.$$ (5)

-continued $$\exp\left(i\frac{\hat{H}_{LCAO}t}{\hbar}\right)|\text{antibonding}\rangle\bigg] =$$

$$\frac{1}{\sqrt{2}}\left[e^{i\frac{(E_0-\Delta E)t}{\hbar}}|\text{bonding}\rangle + e^{i\frac{(E_0+\Delta E)t}{\hbar}}|\text{antibonding}\rangle\right] =$$

$$\frac{1}{\sqrt{2}}e^{i\frac{(E_0-\Delta E)t}{\hbar}}[|\text{bonding}\rangle + e^{i\frac{2\Delta Et}{\hbar}}|\text{antibonding}\rangle]$$

It is known from the above statement that the electron heretofore localized in the quantum box 1 reaches the quantum box 2 by the time t satisfying:

$$\frac{2\Delta Et}{\hbar} = \pi \tag{6}$$

Therefore, within the LCAO approximation, the tunneling time $\tau$ of the electron from the quantum box 1 to the quantum box 2 may be considered as:

$$\tau = \frac{\pi\hbar}{2\Delta E} \tag{7}$$

This tunneling time $\tau$ may more generally be expressed as:

$$\tau \sim \frac{\pi\hbar}{2\Delta E} \tag{8}$$

It is known from the foregoing statement that, by most simplifying the dynamics of electrons in a coupled quantum boxes system, electrons move due to tunnelling dependent on the magnitude of the transfer energy $\Delta E$ between quantum boxes.

Next consideration is made to determine a formula for the transfer energy $\Delta E$ within the LCAO approximation.

Here is taken for consideration a single square quantum box whose side is 2d long. Then its potential energy is:

$$V(x,y) = \begin{cases} -V_0 & (|x| \le d, |y| \le d) \\ 0 & (|x| > d, |y| > d) \end{cases} \tag{9}$$

Therefore, the Hamiltonian of the system is:

$$\hat{H}_{isolate} = K + V(x,y) \tag{10}$$

where K is the kinetic energy. When the ground state of the Hamiltonian is $|\Psi_0\rangle$ and its energy is $E_0$, $$\hat{H}_{isolate}|\Psi_0\rangle = E_0|\Psi_0\rangle \tag{11}$$

is established.

In contrast, the Hamiltonian of a coupled quantum boxes system comprising two square quantum boxes (see FIG. 2) can be expressed as:

$$\hat{H}_{coupled} = K + V_+(x,y) + V_-(x,y) \tag{12}$$

When, however, the center coordinates of one of the quantum boxes and the center coordinates of the other of the quantum boxes are written as shown in FIG. 2, it results in:

$$V_+(x,y) = V(x-\tau_x, y-\tau_y)$$

$$V_-(x,y) = V(x+\tau_x, y+\tau_y) \tag{13}$$

On the other hand, the wave function of the ground state of the Hamiltonian of the single square quantum box described by Equation (10) is:

$$\Psi_0(x,y) = \langle x,y|\Psi_0\rangle \tag{14}$$

Note that the following equations $$\Psi_{0+}(x,y) = \Psi_0(x-\tau_x, y-\tau_y)$$

$$\Psi_{0-}(x,y) = \Psi_0(x+\tau_x, y+\tau_y) \tag{15}$$

respectively satisfy $$[K+V_+]\Psi_{0+}(x,y) = E_0\Psi_{0+}(x,y)$$

$$[K+V_-]\Psi_{0-}(x,y) = E_0\Psi_{0-}(x,y) \tag{16}$$

After the foregoing preparation, consideration is made to determine the energy eigenvalue of the Hamiltonian of the coupled quantum boxes system shown by Equation (12) in the two-dimensional subspace spanned by the eigenstates of the single square quantum box described by Equation (15). Since the two eigenstates described by Equation (15) are not orthogonal, first made are orthogonal bases, for example, as follows:

$$|a\rangle = \frac{1}{\sqrt{2(1-\langle\psi_{0-}|\psi_{0+}\rangle)}}(|\psi_{0+}\rangle - |\psi_{0-}\rangle) \tag{17}$$

$$|b\rangle = \frac{1}{\sqrt{2(1+\langle\psi_{0-}|\psi_{0+}\rangle)}}(|\psi_{0+}\rangle + |\psi_{0-}\rangle)$$

On the basis of the orthogonal bases, Hamiltonian matrix elements are calculated as follows:

$$\langle a|\hat{H}_{coupled}|a\rangle = \frac{1}{\sqrt{2(1-\langle\psi_{0-}|\psi_{0+}\rangle)}}(\langle\psi_{0+}| - \langle\psi_{0-}|)[K+V_++V_-](|\psi_{0+}\rangle - |\psi_{0-}\rangle) = \tag{18}$$

$$\frac{1}{\sqrt{2(1-\langle\psi_{0-}|\psi_{0+}\rangle)}}(\langle\psi_{0+}| - \langle\psi_{0-}|)[(K+V_+)|\psi_{0+}\rangle + V_-|\psi_{0+}\rangle - V_+|\psi_{0-}\rangle - (K+V_-)|\psi_{0-}\rangle] =$$

$$\frac{1}{\sqrt{2(1-\langle\psi_{0-}|\psi_{0+}\rangle)}}(\langle\psi_{0+}| - \langle\psi_{0-}|)[E_0|\psi_{0+}\rangle + V_-|\psi_{0+}\rangle - V_+|\psi_{0-}\rangle - E_0|\psi_{0-}\rangle] =$$

$$\frac{1}{\sqrt{2(1-\langle\psi_{0-}|\psi_{0+}\rangle)}}(\langle\psi_{0+}| - \langle\psi_{0-}|)[E_0|\psi_{0+}\rangle + V_-|\psi_{0+}\rangle - V_+|\psi_{0-}\rangle - E_0|\psi_{0-}\rangle] =$$

$$\frac{1}{\sqrt{2(1-\langle\psi_{0-}|\psi_{0+}\rangle)}}(\langle\psi_{0+}| - \langle\psi_{0-}|)[E_0|\psi_{0+}\rangle + V_-|\psi_{0+}\rangle - V_+|\psi_{0-}\rangle - E_0|\psi_{0-}\rangle] =$$

$$\frac{1}{\sqrt{2(1-\langle\psi_{0-}|\psi_{0+}\rangle)}}[2E_0(1-\langle\psi_{0-}|\psi_{0+}\rangle) + 2\langle\psi_{0+}|V_-|\psi_{0+}\rangle - 2\langle\psi_{0+}|V_+|\psi_{0-}\rangle] =$$

$$E_0 + \frac{\langle\psi_{0+}|V_-|\psi_{0+}\rangle - \langle\psi_{0+}|V_+|\psi_{0-}\rangle}{1-\langle\psi_{0-}|\psi_{0+}\rangle}$$

$$<b|\hat{H}_{coupled}|b> = \frac{1}{\sqrt{2(1+<\psi_{0-}|\psi_{0+}>)}} (<\psi_{0+}|+<\psi_{0-}|)[K+V_{+}+V_{-}](|\psi_{0+}>+|\psi_{0-}>) = \quad (19)$$

$$= \frac{1}{\sqrt{2(1+<\psi_{0-}|\psi_{0+}>)}} (<\psi_{0+}|+<\psi_{0-}|)[(K+V_{+})|\psi_{0+}>+V_{-}|\psi_{0+}>+V_{+}|\psi_{0-}>+(K+V_{-})|\psi_{0-}>] =$$

$$= \frac{1}{\sqrt{2(1+<\psi_{0-}|\psi_{0+}>)}} (<\psi_{0+}|+<\psi_{0-}|)[E_{0}|\psi_{0+}>+V_{-}|\psi_{0+}>+V_{+}|\psi_{0-}>+E_{0}|\psi_{0-}>] =$$

$$= \frac{1}{\sqrt{2(1+<\psi_{0-}|\psi_{0+}>)}} (<\psi_{0+}|+<\psi_{0-}|)[E_{0}|\psi_{0+}>+V_{-}|\psi_{0+}>+V_{+}|\psi_{0-}>+E_{0}|\psi_{0-}>] =$$

$$= \frac{1}{\sqrt{2(1+<\psi_{0-}|\psi_{0+}>)}} (<\psi_{0+}|+<\psi_{0-}|)[E_{0}|\psi_{0+}>+V_{-}|\psi_{0+}>+V_{+}|\psi_{0-}>+E_{0}|\psi_{0-}>] =$$

$$= \frac{1}{\sqrt{2(1+<\psi_{0-}|\psi_{0+}>)}} [2E_{0}(1+<\psi_{0-}|\psi_{0+}>)+2<\psi_{0+}|V_{-}|\psi_{0+}>+2<\psi_{0+}|V_{+}|\psi_{0-}>] =$$

$$= E_{0}+\frac{<\psi_{0+}|V_{-}|\psi_{0+}>+<\psi_{0+}|V_{+}|\psi_{0-}>}{1+<\psi_{0-}|\psi_{0+}>}$$

$$<b|\hat{H}_{coupled}|a> = 0 \quad (20)$$
$$<a|\hat{H}_{coupled}|b> = 0 \quad (21)$$

Note that the calculation of these matrix elements used Equation (16) and the following equations:

$$<\Psi_{0+}|V_{-}|\Psi_{0+}>=<\Psi_{0-}|V_{+}|\Psi_{0-}>$$

$$<\Psi_{0+}|V_{-}|\Psi_{0-}>=<\Psi_{0+}|V_{+}|\Psi_{0-}> \quad (22)$$

As apparent from Equations (20) and (21), since non-diagonal elements of the Hamiltonian matrix are zero, the Hamiltonian matrix is in fact diagonalized. Therefore, energy eigenvalues are:

$$<b|\hat{H}_{coupled}|b>, <a|\hat{H}_{coupled}|a>$$

and their eigenvectors are:

$$|b>=|bonding>, |a>=|antibonding> \quad (23)$$

In Equations (18) and (19), because of the localization of the wave function, $$1 >> <\Psi_{0-}|\Psi_{0+}>$$

$$<\Psi_{0+}|V_{-}|\Psi_{0+}> <<< \Psi_{0+}|V_{+}|\Psi_{0-}> \quad (24)$$

are established, and so energies may be considered as:

$$E_{antibonding} \sim E_{0}+\Delta E$$

$$E_{bonding} \sim E_{0}-\Delta E$$

$$\Delta E = |<\Psi_{0+}|V_{+}|\Psi_{0-}>| \quad (25)$$

When the transfer energy (ΔE) is small, electrons tend to be localized in respective quantum boxes, and movements of electrons among quantum boxes due to tunneling are suppressed. Moreover, if deviation of energy levels of the quantum boxes 1 and 2 is larger than the transfer energy, the eigenstates are strongly localized at the quantum boxes 1 or 2.

Consideration will be made below by taking, as an example, a quantum device in which electrons existing in quantum boxes are variable in number and interaction energy between electrons is amply larger than transfer energy between quantum boxes. Discussion made below also applies even when electrons are replaced by holes.

In a quantum device in which the interaction energy between electrons is amply larger than the transfer energy between quantum boxes, that is, the interaction between electrons is dominant, electrons existing in respective quantum boxes have some stable spatial distributions due to their interactions. When such a stable spatial distribution is realized, a characteristic behavior occurs in changes in number of electrons in the quantum box system with respect to changes in chemical potential such that, within certain ranges, electrons are held constant in number regardless of changes in chemical potential.

That is, there are regions expressed by $\partial <\rho>/\partial \mu \sim 0$ where $\rho$ is the density of electrons (the number of electrons in the quantum box system divided by the number of quantum boxes) of the quantum box system, and $\mu$ is a non-dimensional quantity obtained by multiplying the chemical potential by the inverse temperature. When the number of quantum boxes in the quantum box system is N, fluctuation in the electron density of the quantum box system is:

$$(<(\rho-<\rho>)^{2}>)^{1/2}=(1/N^{1/2})(\partial <\rho>/\partial \mu)^{1/2}$$

and this describes that fluctuation in electron density disappears in the region of $\partial <\rho>/\partial \mu \sim 0$. The symbol $<>$ indicates that a statistical average is used.

By utilizing stable spatial distributions of electrons in the quantum box system, disappearance of fluctuation in electron density in the quantum box system, or the characteristic feature of changes in the number of electrons of the quantum box system, a device using a relatively small number of electrons and having new functions, such as the ability of holding three or more states, can be realized. This device is low in power consumption because a relatively small number of electrons is used. Specific examples of devices with such new functions involve those which can hold many valued logic states, with stable states of spatial distribution of electrons corresponding to a plurality of logic states. The number of stable states to be taken may be varied by design.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

An embodiment of the invention will be described below with reference to the drawings.

Figure 1:
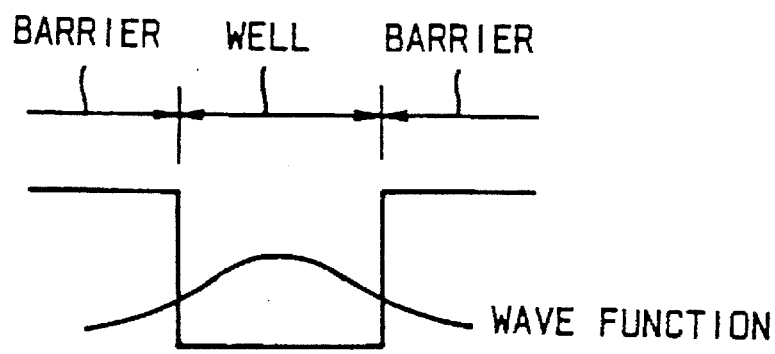
FIG. 1 is a schematic view schematically showing the concept of a potential well of a single quantum box and a wave-function of the ground state of an electron in the potential well.
Figure 2:
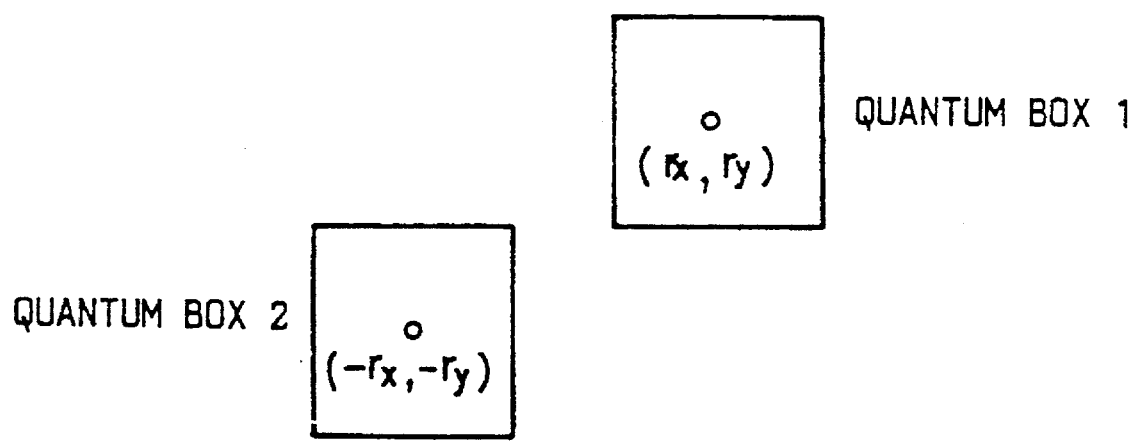
FIG. 2 is a schematic view showing a coupled quantum boxes system including two quantum boxes.
Figure 3:
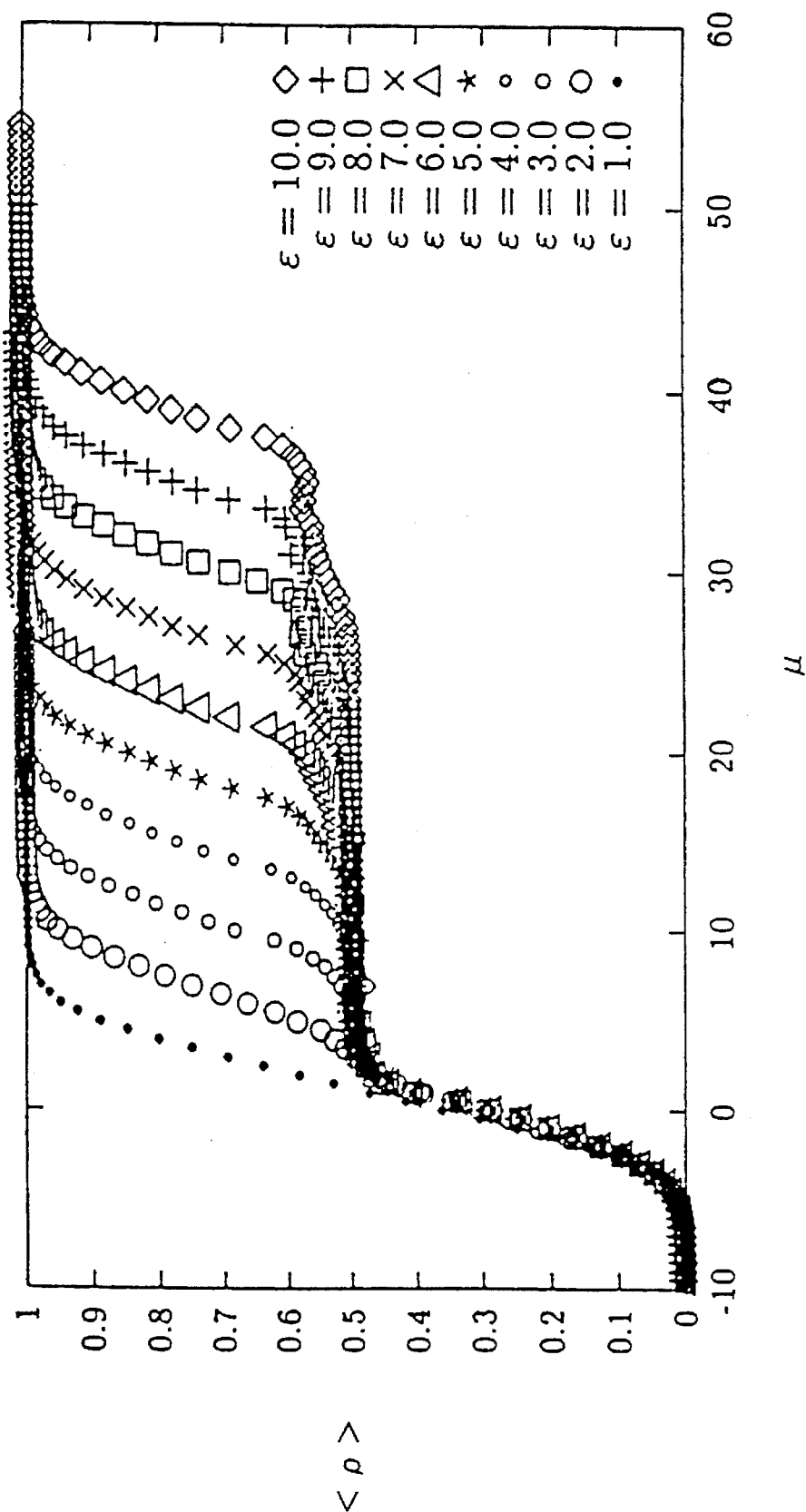
FIG. 3 is a graph showing a result of numerical calculation by Monte Carlo simulation executed on a quantum boxes array in which quantum boxes are arranged in the form of a 32×32 sized square lattice.

Before describing embodiments of the invention, explained below is a result of numerical calculation by the Monte Carlo simulation executed on a quantum boxe array in which quantum boxes are arranged in the form of a 32×32 sized square lattice. The result is shown in FIG. 3. The abscissa μ in FIG. 3 indicates non-dimensional quantities obtained by multiplying the chemical potential of the quantum boxes array by the inverse temperatures, and the ordinate indicates a statistical average of electron density of the quantum boxes array. The symbol $\epsilon$ used as a parameter represents non-dimensional quantities obtained by multiplying coulomb energies between nearest quantum boxes in the quantum boxe array by the inverse temperatures. This calculation is based on the assumption that electrons are confined in quantum boxe by finite potential barriers, there is only one bound state in which an electron having an energy level common to all of the quantum boxes in the quantum boxe array is localized at each quantum box (this energy can be determined as 0 without losing the generality), on-site coulomb energy is amply large, there is no bound state in which two electrons different in spin are localized at a single quantum box, and transfer energy between quantum boxes and inter-site coulomb energy between quantum boxes other than then nearest ones may be disregarded substantially.

FIG. 3 describes that electron density $\langle\rho\rangle$ in the quantum box array have three stable values $\langle\rho\rangle\sim0$, ½ and 1. At one of these three values of $\langle\rho\rangle$, spatial distribution of electrons in the quantum box array represents the state where no quantum box contain an electron ($\langle\rho\rangle\sim0$), the state where quantum boxes containing electrons and quantum boxes containing no electron appear alternatingly ($\langle\rho\rangle\sim\frac{1}{2}$), or the state where each quantum box contains one electron ($\langle\rho\rangle\sim1$). Therefore, by utilizing these three stable spatial distributions of electrons, three valued states can be held.

FIG. 3 describes that these three stable states of electrons appear only at values of $\epsilon$ approximately above 3.0~4.0. It is therefore known that, assuming the coulomb energy of the nearest quantum boxes in the quantum boxes array is 10 meV or so, the quantum box array operates in the range of temperatures lower than approximately 30~40 K. The existence of any one of three stable states of electrons in the quantum box array can be regarded as a result of generation of an energy gap due to many body interactions of electrons. Then, two effective energy levels dependent on the electron density $\langle\rho\rangle$ have probably been produced in the quantum box system which originally had only one energy level. For example, in case of $\epsilon$=10.0, $\langle\rho\rangle$ rises near μ~0.0 and near μ~40.0 as the chemical potential μ increases. Thus the effective energy level in the range of 0~½ of $\langle\rho\rangle$ is the energy corresponding to the proximity of μ~0.0, and the effective energy level in the range of ½~1 of $\langle\rho\rangle$ is the energy corresponding to the proximity of μ~40.0.

Figure 4:
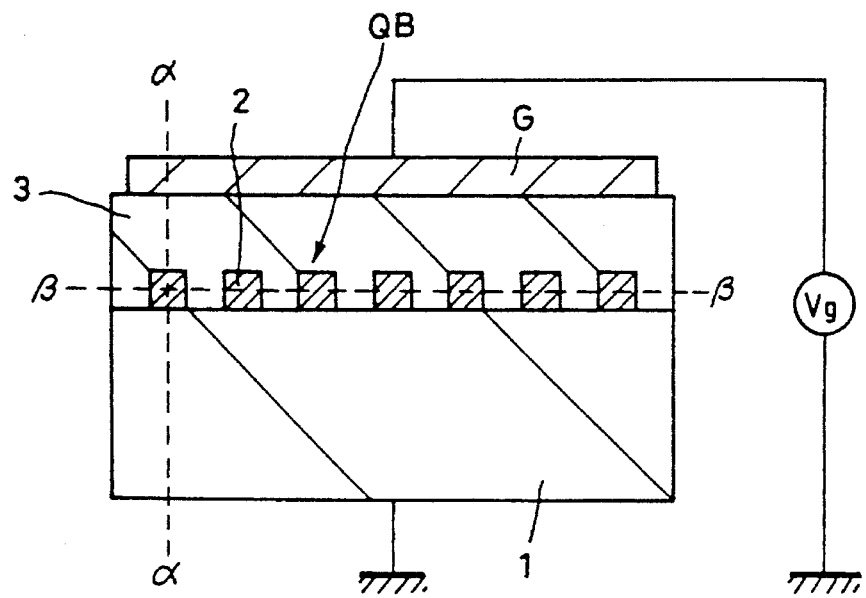
FIG. 4 is a cross-sectional view of a quantum device according to an embodiment of the invention.

Based on the foregoing consideration, an embodiment of the invention will be explained. FIG. 4 shows a quantum device according to the embodiment of the invention.

As shown in FIG. 4, the quantum device according to the embodiment is made by two-dimensionally (for example, in the form of a square lattice) providing a plurality of box-shaped quantum well portions 2 made of a semiconductor on a barrier layer 1 made of a semiconductor and by providing a barrier layer 3 made of a semiconductor or insulator on the barrier layer 1 so as to cover the quantum well portions 2. The structure surrounding each quantum well portion 2 with the barrier layers 1, 3 makes up a quantum box QB, and a plurality of quantum boxes QB are two-dimensionally arranged to form a two-dimensional quantum box array. Further provided on the barrier layer 3 is a control electrode G made of a conductor and externally variable in potential $V_g$. When the barrier layer 3 is made of a semiconductor, the control electrode G and the barrier layer 3 form a Schottky junction. In this case, the barrier layer 1 is connected to ground.

When bottom energies of conduction bands of respective materials of the barrier layer 1, quantum well portions 2 and barrier layer 3 are $E_{c1}$, $E_{c2}$ and $E_{c3}$, respectively, they satisfy the relation of $E_{c3}>E_{c1}>E_{c2}$. At that time, there exists a bound state where electrons are zero-dimensionally localized in the quantum boxes QB, and energy levels of electrons are discrete.

In this case, the quantum boxes QB in the quantum box array are configured so that interaction energy between electrons is amply larger than transfer energy between quantum boxes QB. For example, when the quantum device is to be operative in the range of temperatures lower than approximately 30~40 K., and the quantum boxes QB are made of a III–V compound semiconductor, the distance between quantum boxes QB is chosen at 10 nm or less. The size of the quantum box QB is chosen, for example, at 5 nm or so. The use of an insulator or a semiconductor with a high potential barrier and a small dielectric constant as the material of the barrier layer 3 is desirable for ensuring an amply larger interaction energy between electrons than the transfer energy between quantum boxes QB.

To realize the quantum device according to the embodiment by using semiconductors in lattice matching with each other, AlGaAs may be used as the material for the barrier layer 1, GaAs for the quantum well portions 2, and AlAs for the barrier layer 3.

Figure 5:
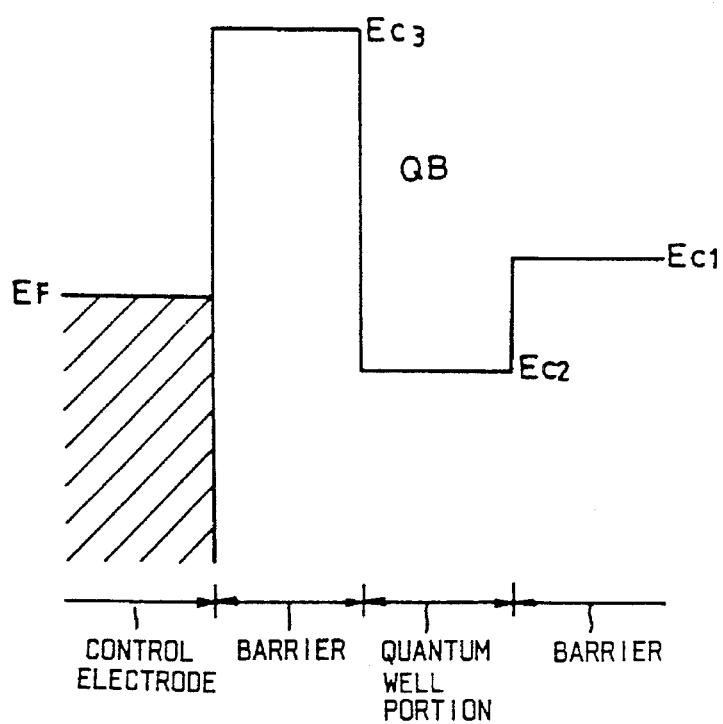
FIG. 5 is an energy band diagram in a direction along the α—α line of FIG. 4.
Figure 6:
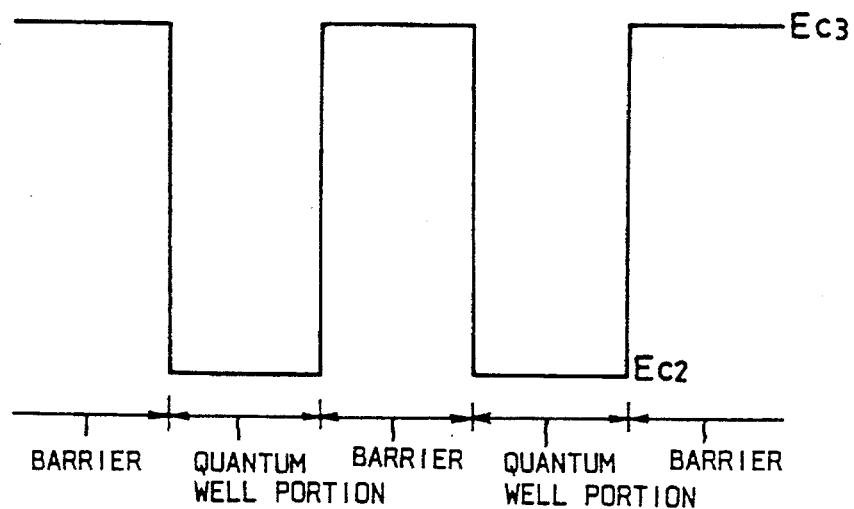
FIG. 6 is an energy band diagram in a direction along the β—β line of FIG. 4.

The quantum device according to the embodiment has an energy band structure shown in FIG. 5 and FIG. 6 taken along the α—α line and β—β line of FIG. 4, respectively. In FIG. 5, $E_F$ is the Fermi energy.

In the quantum device with the above-explained structure according to the embodiment, by varying the potential $V_g$ of the control electrode G, the chemical potential of the quantum boxes array can be changed, and the number of electrons existing in the bound state in the quantum box array can be changed. Therefore, according to the principle stated above, a device capable of holding many valued logic states can be realized by assigning some stable spatial distributions of electrons to the plurality of logic states. That is, if the system of the quantum device is regarded as a capacitor, with one of its electrode plates being the control electrode G and the other being the quantum boxes array portion, then spatially stable states can exist in distribution of electric charges in the other electrode plate comprising the quantum boxes array portion, fluctuation in electron density disappears when the system is in one of the stable states, and electric charges stored in the capacitor are held constant against changes in voltage applied to the capacitor. Therefore, by using this, a many valued DRAM, for example, can be realized. Further, since the stable states represent a characteristic spatial distribution of electric charges, it may be used also as a spatial pattern processing filter, for example.

A plurality of stable spatial distributions of electrons in the quantum box array of the quantum device according to the embodiment can be read out by a method utilizing the dependency of effective energy levels of electrons upon the number (density) of electrons in the quantum box array. A specific one of such methods will be explained below.

As stated with reference to the example of numerical calculation, effective energy levels of electrons in the quantum box array depend on the density of electrons in the quantum box array. Accordingly, the wavelength of light the quantum box array can absorb is different depending on whichever of the plurality of stable spatial distributions of electrons has been realized. Absorption of light is attendant either to transition from the valence band to the effective energy level in the bound state or to transition from the effective energy level in the bound state to the scattering state. Therefore, by utilizing this and by using a light source capable of irradiating light of a plurality of wavelengths, the state of spatial distribution of electrons can be known from light absorbed or not absorbed by the quantum box array.

Figure 7:
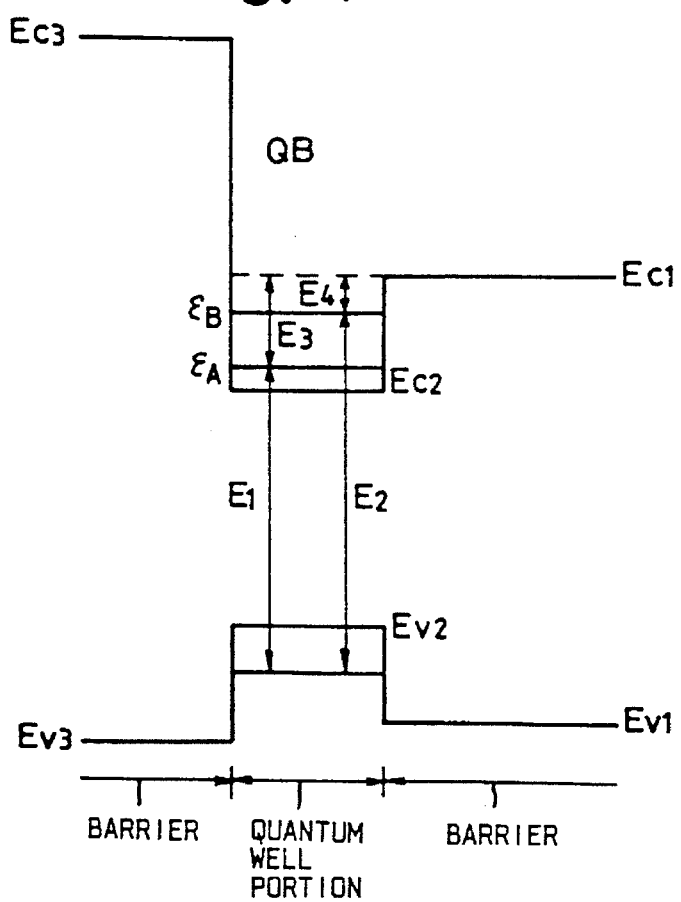
FIG. 7 is an energy band diagram for explaining a way of reading out a spatial distribution of electrons in a quantum boxe array of the quantum device according to the embodiment of the invention.

This is specifically explained below on the foregoing case taken for numerical calculation. In the case taken above (see the case of $\epsilon=10.0$ in FIG. 3), in the range where $<\rho>$ is $0$–$\frac{1}{2}$, the effective energy level was the energy corresponding to the proximity of $\mu$–$0.0$ (designated $\epsilon_A$), and in the range where $<\rho>$ is $\frac{1}{2}$–$1$, it was the energy corresponding to the proximity of $\mu$–$40.0$ (designated $\epsilon_B$). In this case, absorption and non-absorption of light having the frequency of $v_i=E_i/h$ (h is the Planck's constant) corresponding to the energy difference $E_i$ (i=1–4) shown in FIG. 7 become as shown in the following table by Yes (absorption) and No (non-absorption). Note that, in FIG. 7, top energies of valence bands of respective materials of the barrier layer 1, quantum well portions 2 and barrier layer 3 are expressed by $E_{v1}$, $E_{v2}$ and $E_{v3}$.

| $\rho$ | $v_1$ | $v_2$ | $v_3$ | $v_4$ |
|---|---|---|---|---|
| 0 | Yes | No | No | No |
| ½ | No | Yes | Yes | No |
| 1 | No | No | Yes | Yes |

Therefore, by using light with arbitrary two of the frequencies $v_1$–$v_4$, the three states of spatial distribution of electrons in the quantum box array can be read out distinctively.

As described above, in the quantum device according to the embodiment, since the quantum box array is arranged so that interaction energy between electrons is amply larger than the transfer energy between quantum boxes QB, a plurality of, e.g. three, stable spatial distributions of electrons can exist in the quantum box array, and so the quantum device can have, for example, three states. This quantum device can be used as a device having many valued logic states. In addition, when a stable spatial distribution of electrons is held in the quantum box array, fluctuation in density of electrons is suppressed by interactions between electrons in spite of using a relatively small number of electrons, and the density of electrons is statistically stabilized. Therefore, the device operation is stabilized.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, although the embodiment has been explained as using a two-dimensional quantum box array with quantum boxes arranged on a two-dimensional plane, the invention may also be applied to devices having one-dimensional or three-dimensional quantum box arrays with quantum boxes in one-dimensional or three-dimensional arrangement.

As explained above since the quantum device according to the invention is configured so that, in particular, interaction energy between electrons or holes is larger than transfer energy between quantum boxes, three or more stable spatial distributions of electrons or holes can exist in a quantum box system comprising a plurality of quantum boxes, and so a device capable of taking three or more states can be realized. In addition, since the quantum device can use a relatively small number of electrons or holes, its power consumption can be reduced. Furthermore, when stable spatial distributions of electrons are realized, the quantum device can suppress fluctuation in density of electrons by interactions between electrons or holes in spite of using a relatively small number of electrons or holes, which results in statistical stabilization of the density of electrons, and can hence stabilize its operation.

What is claimed is:

1. A quantum device comprising a plurality of quantum boxes, wherein electrons or holes existing in said quantum boxes are variable in number to establish plural stable states, and interaction energy between said electrons or holes is larger than transfer energy between said quantum boxes.

2. The quantum device according to claim 1, utilizing at least one of a plurality of statistically stable or metastable states of spatial distribution of electrons or holes resulting from interactions between electrons or holes in said quantum boxes, disappearance of fluctuation in density of electrons or holes in said quantum boxes, and a characteristic feature of changes in number of electrons or holes in said quantum boxes.

3. The quantum device according to claim 1 wherein a respective one of the states of spatial distribution of electrons or holes in said quantum boxes is read out by utilizing effective energy levels due to many body interactions of electrons or holes.

4. The quantum device according to claim 1, comprising:

a first barrier layer;

a plurality of box-shaped quantum well portions provided on said first barrier layer;

a second barrier layer provided on said first barrier layer so as to cover said quantum well portions; and a control electrode provided on said second barrier layer, said first barrier layer, said second barrier layer and said box-shaped quantum well portions constituting said quantum boxes, and electrons or holes in said quantum boxes being variable in number in response to changes in potential of said control electrode.

* * * * *